(12) United States Patent
Gershowitz et al.

(10) Patent No.: US 9,468,052 B2
(45) Date of Patent: *Oct. 11, 2016

(54) LED ARRAY MEMBER AND INTEGRATED CONTROL MODULE ASSEMBLY HAVING ACTIVE CIRCUITRY

(71) Applicant: Bridgelux, Inc., Livermore, CA (US)

(72) Inventors: Michael Neal Gershowitz, San Jose, CA (US); R. Scott West, Pleasanton, CA (US); Babak Imangholi, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/847,819

(22) Filed: Sep. 8, 2015

(65) Prior Publication Data

US 2015/0377466 A1    Dec. 31, 2015

Related U.S. Application Data

(63) Continuation of application No. 14/530,042, filed on Oct. 31, 2014, now Pat. No. 9,155,145, which is a continuation of application No. 14/046,459, filed on Oct. 4, 2013, now Pat. No. 8,941,129.

(60) Provisional application No. 61/856,552, filed on Jul. 19, 2013.

(51) Int. Cl.
*H01L 29/18* (2006.01)
*H01L 33/00* (2010.01)
(Continued)

(52) U.S. Cl.
CPC ............. *H05B 33/0815* (2013.01); *F21K 9/20* (2016.08); *F21V 23/006* (2013.01); *F21V 23/02* (2013.01);
(Continued)

(58) Field of Classification Search
CPC ............. H01L 25/167; H01L 27/3225; H01L 27/3251; H01L 27/3253; H01L 2227/323; H01L 2227/326; H01L 2251/536; H01L 2251/50; H01L 2251/566
See application file for complete search history.

(56) References Cited

U.S. PATENT DOCUMENTS 7,177,333 B2   2/2007   Simoun-Ou et al. ........... 372/36
8,274,644 B2   9/2012   Nisper et al. .................. 356/45
(Continued)

OTHER PUBLICATIONS

Image of ProLight Opto Driver on Board from ProLight Opto Technology Corporation downloaded from Internet on Oct. 24, 2013 from site http://www.led-professional.com/products/led-modules-led-light-engines/prolight-opto-launches-new-driver-on-board-dob-series.

(Continued)

*Primary Examiner* — Thanh Y Tran
(74) *Attorney, Agent, or Firm* — Imperium Patent Works; T. Lester Wallace; Darien K. Wallace

(57) ABSTRACT

An LAM/ICM assembly comprises an integrated control module (ICM) and an LED array member (LAM). The ICM includes interconnect through which power from outside the assembly is received. In a first novel aspect, active circuitry is embedded in the ICM. In one example, the circuitry monitors LED operation, controls and supplies power to the LEDs, and communicates information into and out of the assembly. In a second novel aspect, a lighting system comprises an AC-to-DC converter and a LAM/ICM assembly. The AC-to-DC converter outputs a substantially constant current or voltage. The magnitude of the current or voltage is adjusted by a signal output from the LAM/ICM. In a third novel aspect, the ICM includes a switching DC-to-DC converter. An AC-to-DC power supply supplies a roughly regulated supply voltage. The switching converter within the LAM/ICM receives the roughly regulated voltage and supplies a regulated LED drive current to its LEDs.

20 Claims, 16 Drawing Sheets

(51) Int. Cl.
  *H05B 33/08* (2006.01)
  *H01L 25/16* (2006.01)
  *F21V 23/02* (2006.01)
  *H05B 37/02* (2006.01)
  *F21V 23/00* (2015.01)
  *F21V 29/70* (2015.01)
  *H01L 25/075* (2006.01)
  *H01L 33/48* (2010.01)
  *H01L 33/50* (2010.01)
  *H01L 33/54* (2010.01)
  *H01L 33/62* (2010.01)
  *H05K 1/14* (2006.01)
  *H05K 3/00* (2006.01)
  *F21Y 101/00* (2016.01)

(52) U.S. Cl.
  CPC ........... *F21V 29/70* (2015.01); *H01L 25/0753* (2013.01); *H01L 25/167* (2013.01); *H01L 33/486* (2013.01); *H01L 33/507* (2013.01); *H01L 33/54* (2013.01); *H01L 33/62* (2013.01); *H05B 33/083* (2013.01); *H05B 33/089* (2013.01); *H05B 33/0824* (2013.01); *H05B 33/0827* (2013.01); *H05B 33/0842* (2013.01); *H05B 33/0845* (2013.01); *H05B 33/0884* (2013.01); *H05B 37/0272* (2013.01); *F21Y 2101/00* (2013.01); *F21Y 2105/10* (2016.08); *F21Y 2115/10* (2016.08); *H01L 2224/48091* (2013.01); *H01L 2224/48137* (2013.01); *H01L 2224/73265* (2013.01); *H01L 2924/181* (2013.01); *H05K 1/142* (2013.01); *H05K 3/0061* (2013.01); *H05K 2201/10106* (2013.01)

(56) References Cited

U.S. PATENT DOCUMENTS

| | | | |
|---|---|---|---|
| 8,371,717 | B2 | 2/2013 | Lai .................. 362/276 |
| 8,941,129 | B1* | 1/2015 | Gershowitz ........ H05B 33/0842 257/100 |
| 9,155,145 | B2* | 10/2015 | Gershowitz ........ H05B 33/0842 |
| 2003/0031028 | A1 | 2/2003 | Murray et al. ................. 362/545 |
| 2008/0290353 | A1* | 11/2008 | Medendorp, Jr. ..... H01L 25/167 257/89 |
| 2011/0199203 | A1 | 8/2011 | Hsu .................. 340/449 |
| 2012/0032612 | A1 | 2/2012 | Antony et al. ................ 315/297 |
| 2012/0062150 | A1 | 3/2012 | West .............................. 315/309 |
| 2012/0188762 | A1 | 7/2012 | Joung et al. ................... 362/235 |
| 2012/0243232 | A1 | 9/2012 | Bertram et al. .......... 362/249.02 |
| 2012/0256548 | A1 | 10/2012 | Collins et al. ................ 315/151 |
| 2013/0084748 | A1 | 4/2013 | Zaderej et al. .......... 439/620.02 |
| 2013/0176732 | A1 | 7/2013 | McGowan et al. ...... 362/249.02 |
| 2013/0181607 | A1 | 7/2013 | Yotsumoto et al. ........... 315/70 |
| 2014/0063803 | A1 | 3/2014 | Yaphe et al. .................. 362/247 |
| 2014/0247584 | A1* | 9/2014 | Kodama ............. H01L 27/3227 362/183 |

OTHER PUBLICATIONS

Datasheet for Molex part 180414-0102, Molex Incorporated, downloaded from Internet on Oct. 24, 2013 from http://www.molex.com/webdocs/datasheets/pdf/en-us/1804140102_SOLID_STATE_LIGHTI.pdf.

* cited by examiner

VIEW OF TOP OF LAM/ICM ASSEMBLY
(PERSPECTIVE TOP VIEW)

VIEW OF TOP OF LAM/ICM ASSEMBLY
(PERSPECTIVE TOP VIEW)

VIEW OF BOTTOM OF LAM/ICM ASSEMBLY
(PERSPECTIVE VIEW)

TOP-DOWN VIEW OF LAM/ICM ASSEMBLY
(TOP-DOWN VIEW)

TOP-DOWN VIEW OF ONE EXAMPLE OF A LAM
(SHOWN WITHOUT PHOSPHOR LAYER)

THE LAM FITS UP INTO THE CENTRAL OPENING IN THE
BOTTOM OF THE ICM AND IS FIXED IN PLACE
(CROSS-SECTIONAL SIDE VIEW OF ASSEMBLY)

BOTTOM-UP VIEW OF ICM SHOWING CONTACT PADS ON THE INSIDE LIP OF THE ICM

DETAIL OF A CONTACT PAD OF THE LAM MAKING CONTACT WITH A CONTACT PAD ON THE BOTTOM OF THE INSIDE LIP OF THE ICM

CROSS-SECTIONAL VIEW TAKEN ALONG LINE A-A'
(SHOWN ON A HEAT SINK)

CROSS-SECTIONAL VIEW TAKEN ALONG LINE B-B'
(SHOWN ON A HEAT SINK)

SCHEMATIC OF THE LED ARRAY MEMBER/
INTEGRATED CONTROL MODULE ASSEMBLY

LIGHTING SYSTEM INVOLVING THE LED ARRAY MEMBER/
INTEGRATED CONTROL MODULE ASSEMBLY OF FIG. 13

SCHEMATIC OF THE LED ARRAY MEMBER/
INTEGRATED CONTROL MODULE ASSEMBLY

DIAGRAM OF THE LAM/ICM ASSEMBLY WITH AN
INTEGRATED BUCK CONVERTER

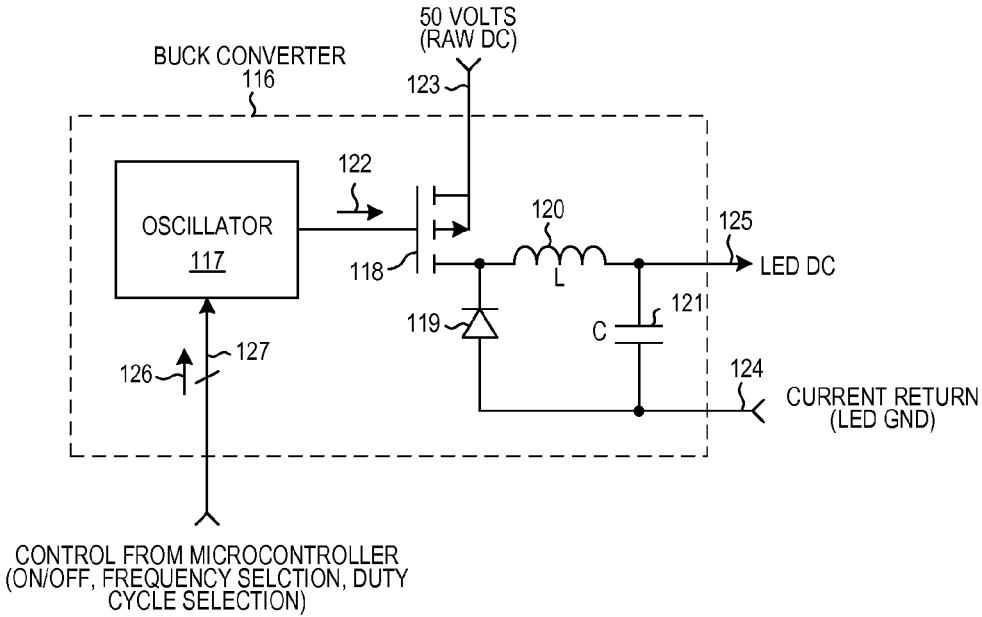

BUCK CONVERTER

FIG. 18

|  | ONE BUCK CONVERTER DRIVING ALL LEDS | SIX BUCK CONVERTERS, EACH DRIVING ONE STRING OF LEDS |
|---|---|---|
| NOMINAL "LED DC" OUTPUT CURRENT | 3.5 AMPS | 0.6 AMPS |
| NOMINAL "LED DC" OUTPUT VOLTAGE | 48 VOLTS | 48 VOLTS |
| NOMINAL RIPPLE | 75% | 75% |
| NOMINAL SWITCHING FREQUENCY | 10 MHZ | 10 MHZ |
| INDUCTANCE L | 70nH | 1uH |
| APPROX SIZE OF INDUCTOR | 7mm x 7mm x 7mm | 2.5mm x 2.5mm x 1mm |
| CAPACITANCE C | 10nF | 1nF |

PARAMETERS AND COMPONENTS OF THE BUCK CONVERTER(S) OF THE LAM/ICM

FIG. 19

ONE WAY TO DRIVE MULTIPLE LED STRINGS WITH
MULTIPLE BUCK CONVERTERS

ANOTHER WAY TO DRIVE MULTIPLE LED STRINGS
WITH MULTIPLE BUCK CONVERTERS

LIGHTING SYSTEM INVOLVING MULTIPLE 48V LED ARRAY MEMBER/
INTEGRATED CONTROL MODULE ASSEMBLIES OF FIG. 16

LED ARRAY MEMBER AND INTEGRATED CONTROL MODULE ASSEMBLY HAVING ACTIVE CIRCUITRY

CROSS REFERENCE TO RELATED APPLICATIONS

This application is a continuation of, and claims priority under 35 U.S.C. §120 from, nonprovisional U.S. patent application Ser. No. 14/530,042 entitled "LED Array Member and Integrated Control Module Assembly Having Active Circuitry," filed on Oct. 31, 2014, now U.S. Pat. No. 9,155,145. Application Ser. No. 14/530,042, in turn, is a continuation of, and claims priority under 35 U.S.C. §120 from, nonprovisional U.S. patent application Ser. No. 14/046,459 entitled "LED Array Member and Integrated Control Module Assembly Having Active Circuitry," filed on Oct. 4, 2013, now U.S. Pat. No. 8,941,129. application Ser. No. 14/046,459, in turn, claims priority under 35 U.S.C. §119 from U.S. Provisional Application No. 61/856,552, entitled "LED Array Member and Integrated Control Module Assembly," filed on Jul. 19, 2013. The subject matter of each of the foregoing documents is incorporated herein by reference.

TECHNICAL FIELD

The present invention relates generally to packaging of light-emitting diodes.

BACKGROUND INFORMATION

A light emitting diode (LED) is a solid state device that converts electrical energy to light. Light is emitted from active layers of semiconductor material sandwiched between oppositely doped layers when a voltage is applied across the doped layers. In order to use an LED chip, the chip is typically enclosed along with other LED chips in a package. In one example, the packaged device is referred to as an LED array. The LED array includes an array of LED chips mounted onto a heat conducting substrate. A layer of silicone in which phosphor particles is embedded is typically disposed over the LED chips. Electrical contact pads are provided for supplying current into the LED array and through the LED chips so that the LED chips can be made to emit light. Light emitted from the LED chips is absorbed by the phosphor particles, and is re-emitted by the phosphor particles so that the re-emitted light has a wider band of wavelengths. Making a light fixture or a "luminaire" out of such an LED array, however, typically involves other components. The LED array generates heat when used. If the temperature of the LED array is allowed to get too high, performance of the LED array may suffer and the LED array may actually fail. In order to remove enough heat from the LED array so as to keep the LED array adequately cool, the LED array is typically fixed in some way to a heat sink. In addition, power must somehow be supplied to the LED array. Power supply circuitry is typically required to supply current to the LED array in a desired and suitable fashion. Optical components are also generally employed to direct and focus the emitted light in a desired fashion. There are many considerations involved in packaging an LED array so that it the array can be used effectively in an overall luminaire. Ways of packaging LED arrays for use in luminaires are sought.

SUMMARY

An LAM/ICM assembly comprises an integrated control module (ICM) and an LED array member (LAM). In one example, the ICM is a thick, washer-shaped, molded plastic member that fits over an upper surface of the LAM and holds the LAM so that a bottom surface of the LAM is held in good thermal contact against a heat sink. The ICM has holes through which threaded screws or bolts can extend. The screws or bolts extend through the holes in the ICM and engage corresponding threaded holes in the heat sink, thereby pulling the washer-shaped ICM toward the heat sink. The ICM in turn presses downward on the top of the LAM and causes the bottom surface of the LAM to be pressed against the heat sink.

In addition, the ICM includes terminals and an interconnect layer through which power from outside the assembly is received onto the assembly and is supplied through the ICM, and through mating sets of contact pads of the ICM and LAM, and to the LAM so that the LEDs of the LAM can be powered and emit light. The ICM does not cover the LEDs of the LAM, but rather a central circular opening in the washer-shaped ICM allows light emitted from the LEDs to pass upward through the central opening and away from the heat sink.

In accordance with a first novel aspect, the washer-shaped ICM includes circuitry involving active electronic components. The circuitry monitors LAM operation, controls and supplies power to the LAM, and communicates information into and out of the assembly. In one example, the circuitry monitors the voltage disposed across a string of LEDs of the LAM, monitors the current flowing through the string of LEDs of the LAM, and monitors the temperature of the LED array. In one example, the ICM includes a printed circuit board to which this circuitry is mounted. The circuitry and the printed circuit board are encapsulated in injection molded plastic. Injection molded plastic overmolds almost all of the printed circuit board including the periphery of the printed circuit board, the upper surface of the printed circuit board, and the lower surface of the printed circuit board. There are, however, exposed contacts on the bottom of the printed circuit board that extend around in the bottom of the inside lip of the central opening in the ICM. When the LAM is fitted up into place into the central opening in the ICM, LAM contact pads on the peripheral edge of upper surface of the LAM make electrical contact with corresponding ICM contact pads on the bottom of the inside lip of the ICM. Power is supplied through the ICM and to the LAM through these contacts, and LAM operation is monitored by the ICM through these contacts.

In accordance with a second novel aspect, a lighting system comprises an AC-to-DC converter and a LAM/ICM assembly, where the LAM/ICM supplies a control signal back to the AC-to-DC converter. The AC-to-DC converter receives a supply voltage from an AC voltage source such as a 110 VAC voltage source. The AC-to-DC converter outputs a substantially constant and regulated current or voltage, where the substantially constant current or voltage has an adjustable magnitude. The level to which the current or voltage is regulated can be changed by appropriate control of the control signal (for example, a zero volts to ten-volt control input signal) to the AC-to-DC converter. If the ICM determines that more power should be received, then the ICM increases the level of the zero to ten volt control signal. If the ICM determines the less power should be received, then the ICM decreases the level of the zero to ten volt control signal. The AC-to-DC converter responds by increasing or decreasing the current or voltage level to which it regulates, as instructed by the control signal.

In the case where the adjustable AC-to-DC converter outputs a regulated constant current, a FET of the LAM/ICM assembly simply turns on or off current flow through the LAM. If LAM current flow is on, then the magnitude of the current flowing from the AC-to-DC converter is determined by the feedback zero volts to ten-volt control signal that the LAM/ICM supplies back to the AC-to-DC converter. Since the AC-to-DC converter output cannot normally be turned fully off by the zero to 10 volt control signal, and because the circuitry of the ICM requires a supply voltage at all times to operate, the ICM includes a semiconductor switch that is operable in the saturated mode as an "on-off" switch to the LAM. The ICM also includes circuitry that controls the semiconductor switch so that when it is desired to have the LAM produce no light whatsoever, the switch is turned "off" interrupting all current flow to the LAM, but leaving voltage output from the AC-to-DC converter at the ICM which can be used to continue to power the circuitry of the ICM while the LAM is "off".

In the case where the adjustable AC-to-DC converter outputs a regulated constant voltage, the ICM of the LAM/ICM assembly receives power from the AC-to-DC converter and supplies power the LEDs of the LAM. The ICM includes a semiconductor switch that is operable in the linear mode. The ICM also includes circuitry that controls the semiconductor switch in the linear mode such that the ICM receives the substantially constant voltage from the AC-to-DC converter and causes a controlled DC current to flow through the LAM. Linear operation of the semiconductor switch is controlled to fine tune the magnitude of the DC current flowing through the LEDs. The circuitry also outputs a control signal that is supplied out of the LAM/ICM assembly and back to the AC-to-DC converter. This control signal is the zero-volt to ten-volt control input signal that controls the AC-to-DC converter. Using this control signal, the circuitry of the LAM/ICM assembly controls the AC-to-DC converter so that the LED voltage at which the LEDs of the LAM are driven is close to (for example, within ten percent of) the voltage at which the constant current is supplied by the AC-to-DC converter to the LAM/ICM assembly. Because the voltages are close, power dissipation of the semiconductor switch in the ICM is low enough that it can perform its regulating function without overheating. In one example, the semiconductor switch is disposed in a semiconductor package, where the semiconductor package of the switch extends from a bottom surface of the ICM and is a good thermal contact with the heat sink.

In accordance with a third novel aspect, a lighting system comprises an AC-to-DC converter and a LAM/ICM assembly. The AC-to-DC converter receives a supply voltage from an AC voltage source such as a 110 VAC voltage source. The AC-to-DC converter in the third novel aspect outputs a substantially constant voltage. The ICM of the LAM/ICM assembly includes a switching DC-to-DC converter. The switching DC-to-DC converter of the ICM receives the substantially constant DC voltage from the AC-to-DC converter and supplies a substantially constant and regulated LED DC drive current to the LAM.

The switching DC-to-DC converter that is embedded in the ICM may be a step down converter whose input voltage is higher than its output voltage, or the switching DC-to-DC converter that is embedded in ICM may be a step up converter whose input voltage is lower than its output voltage, or the switching DC-to-DC converter that is embedded in the ICM may be a combination converter whose incoming input voltage can be higher or lower than the converter output voltage. In one specific example, the switching DC-to-DC converter of the ICM is a step-down buck converter that is switched at about 10 MHz. In other examples, the switching DC-to-DC converter of the ICM is one of a step-up boost converter, a SEPIC converter, and a boost/buck combination converter operating at switching frequencies that may be substantially higher than 10 MHz to keep the physical size of electronic components small.

In one example, the LAM includes a plurality of strings of LEDs. The ICM includes a plurality of buck converters, where all the buck converters are controlled by a common microcontroller that is a part of the ICM. Each string of LEDs is supplied with an independently controlled LED drive current by a corresponding one of the plurality of buck converters. In some embodiments, multiple such LAM/ICM assemblies are driven in parallel by the same AC-to-DC converter, where the AC-to-DC converter outputs only a roughly regulated constant voltage. Within each LAM/ICM, the microcontroller monitors the voltage supplied to each LED string, monitors the current flowing through each LED string, and monitors the temperature of the LED array. The microcontroller controls the current supplied to each string independently of the currents supplied to the other strings. The microcontroller may control the current supplied to each string of LEDs by controlling the switching DC-to-DC converter or converters of the ICM that supply the drive currents to the strings of LEDs. In some examples, the ICM includes an RF (Radio Frequency) transceiver that the microcontroller uses to communicate information to and from other RF transceivers located outside the LAM/ICM assembly. The ICM also includes a terminal through which the microcontroller can communicate digital information into and out of the LAM/ICM assembly. The communication interface can be a wired one through this terminal, or the communication interface can be a wireless one provided by the RF communication link.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 18 is a circuit diagram of a buck converter suitable for use in the LAM/ICM assembly of FIG. 17.

FIG. 19 is a table that sets forth parameters and components characteristics of the buck converter of FIG. 18.

DETAILED DESCRIPTION

Reference will now be made in detail to background examples and some embodiments of the invention, examples of which are illustrated in the accompanying drawings.

Figure 1:
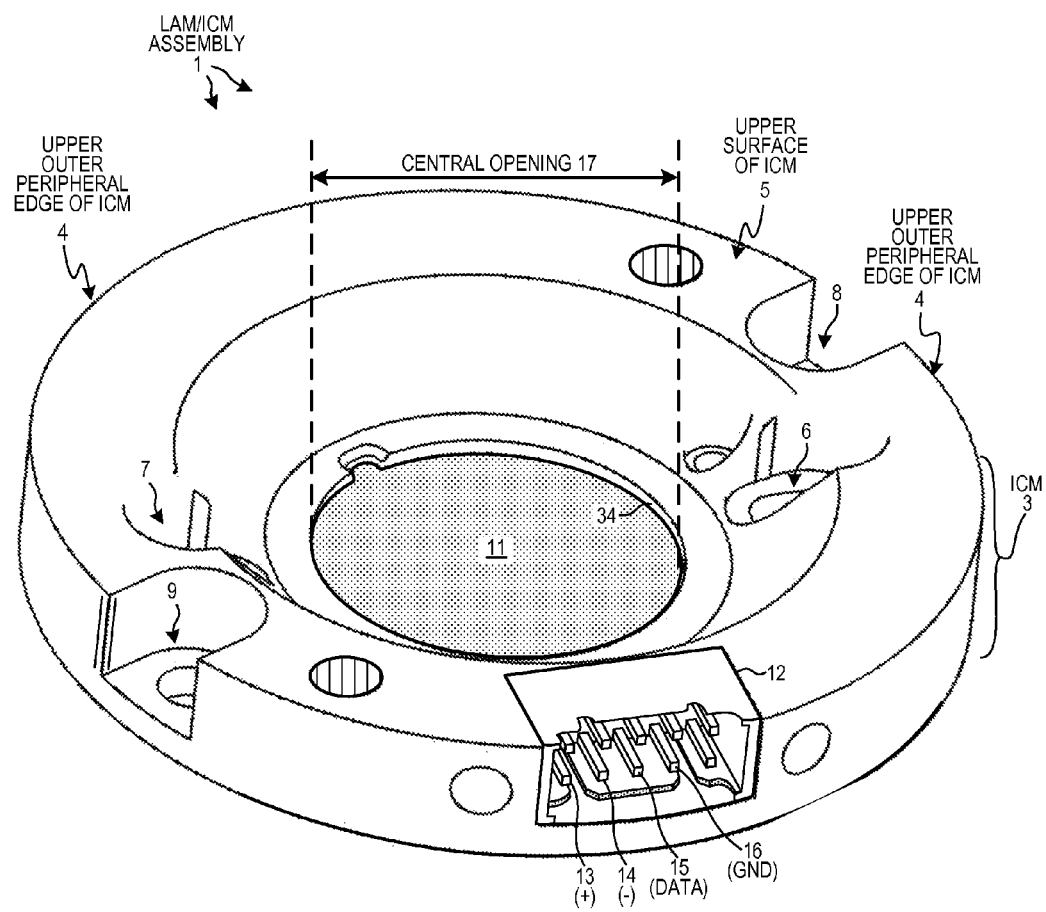
FIG. 1 is a perspective view of the connector side of the top of an LED array member (LAM)/integrated control module (ICM) assembly.
Figure 6:
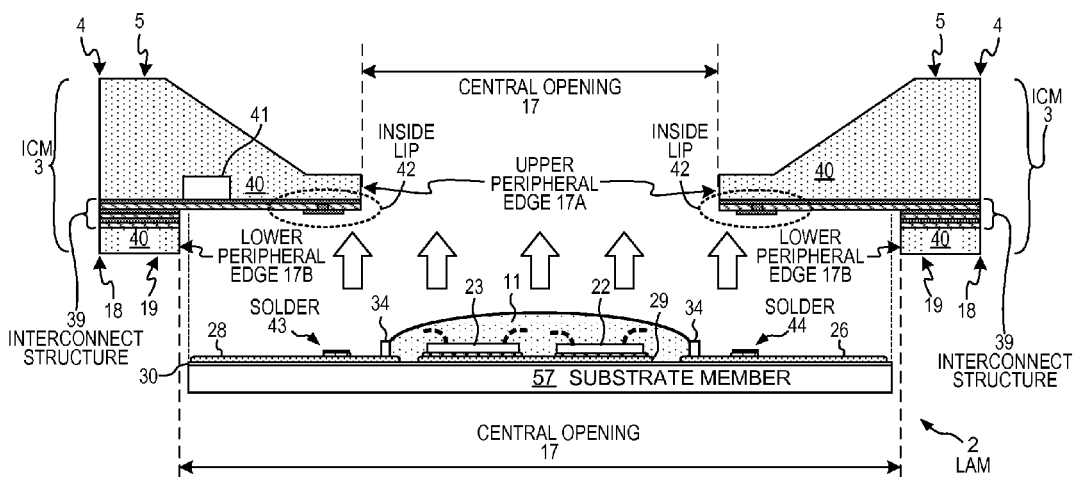
FIG. 6 is cross-sectional view showing how the LAM fits up and into the central opening in the ICM.

FIG. 1 is a perspective view of the top of an LED assembly member/integrated control module assembly (LAM/ICM assembly) 1. There are two parts of the LAM/ICM assembly: a LED assembly member 2 (FIG. 3) and an integrated control module 3. The LED assembly member 2 is hereinafter referred to as the LAM. The integrated control module 3 is hereinafter referred to as the ICM. As illustrated in the diagram, the LAM/ICM assembly 1 is a disk-shaped structure that has a circular upper outer peripheral edge 4. Reference numeral 5 identifies the upper surface of the LAM/ICM assembly 1. The upper surface 5 is a surface of a molded plastic encapsulant 40 (FIG. 6). Two sets of two holes 6-9 are provided through which threaded screws or bolts (not shown) can extend to fix the LAM/ICM assembly 1 to a heat sink. The disk-shaped shaded object in the center in the illustration is a disk-shaped amount of silicone 11. The silicone 11 has phosphor particles embedded in it. This silicone with the embedded phosphor particles overlies an array of light emitting diodes (LEDs). The LEDs are not seen in the diagram because they are disposed under the silicone. The LAM/ICM assembly 1 further includes a header socket 12 and ten header pins, such as pins 13, 14, 15 and 16. Pin 13 is a power terminal through which a supply voltage or a supply current is received into the LAM/ICM assembly 1. Pin 14 is a power terminal through which the current returns and passes out of the LAM/ICM assembly. Pin 14 is a ground terminal with respect to the power terminal 13. Pin 15 is a data signal terminal through which digital signals are communicated into and/or out of the LAM/ICM assembly. Pin 16 is a signal ground for the data signals communicated on pin 15. The illustrated example of the LAM/ICM assembly that has ten header pins is but one example. In other examples, fewer or more header pins are provided in the header socket 12, and assignment of power or signals to the pins can be on different positions than illustrated herein. If the LEDs underneath silicone 11 are powered and emitting light, then the light passes upward through the central circular opening 17 in upper surface 5, and is transmitted upward and away from the LAM/ICM assembly 1.

Figure 2:
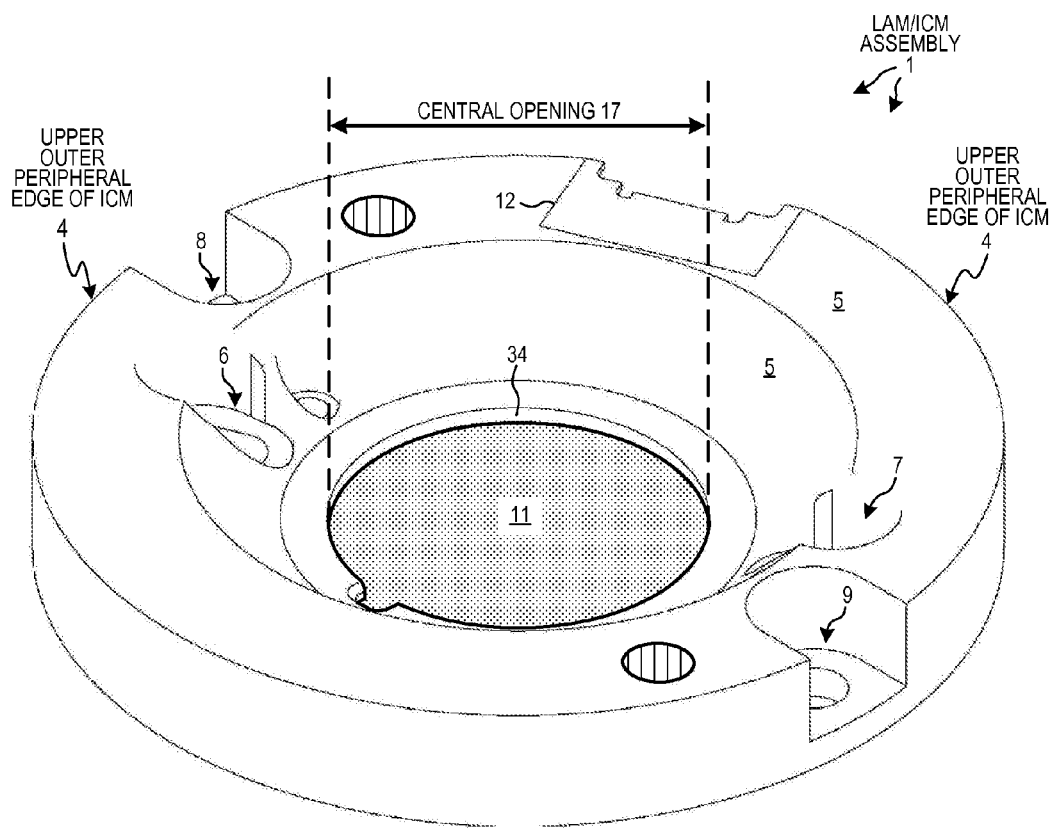
FIG. 2 is a perspective view of the top of an LED array member (LAM)/integrated control module (ICM) assembly from the side opposite the connector.

FIG. 2 is a perspective view of the top of the LAM/ICM assembly, taken from the other side of the LAM/ICM assembly opposite header socket 12.

Figure 3:
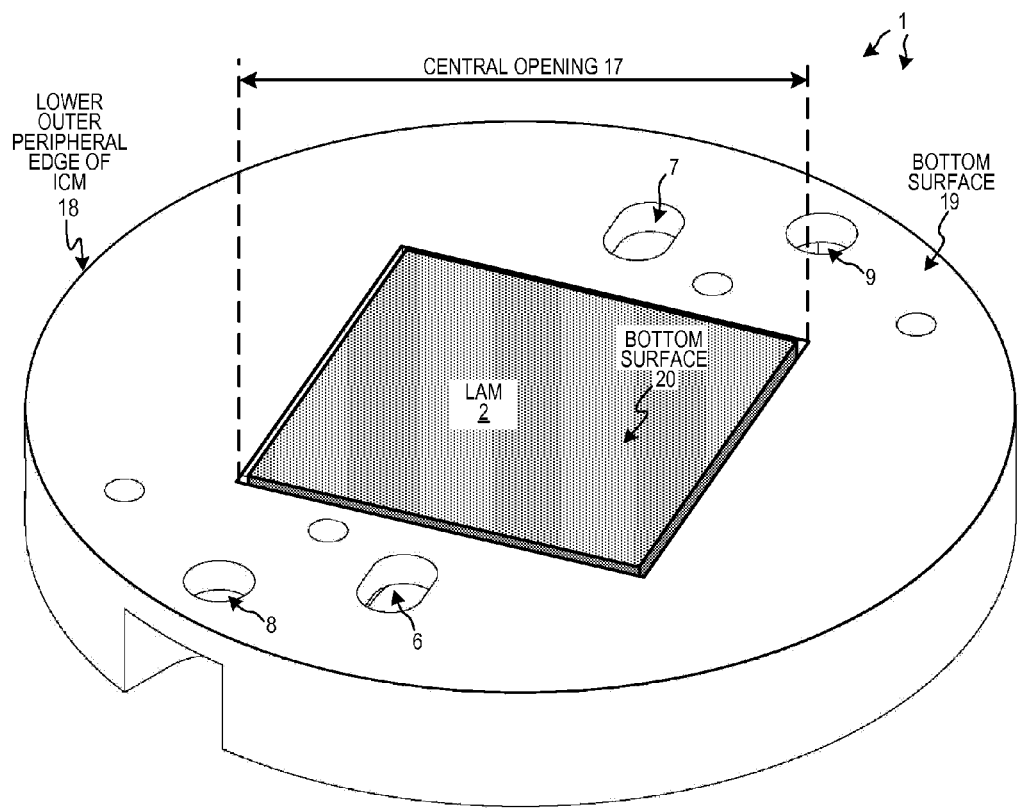
FIG. 3 is a perspective view of the bottom of the LAM/ICM of FIGS. 1 and 2.

FIG. 3 is a perspective view of the bottom of the LAM/ICM assembly 1. Reference numeral 18 identifies the circular lower outer peripheral edge of the LAM ICM assembly. Whereas the shape of central opening 17 at the upper surface 5 of the ICM is circular as pictured in FIG. 1, the shape of the central opening 17 at the bottom surface 19 of the ICM as pictured in FIG. 3 is square. The LAM 2 is disposed in the central opening 17 so that the bottom surface 20 of the LAM 2 protrudes just slightly from the plane of the bottom surface 19 of the ICM 3. From the perspective of the illustration of FIG. 3, the bottom surface 20 of the LAM is slightly higher than is the bottom surface 19 of the ICM. The bottom surface 20 of the LAM is actually the bottom surface of a substrate member 57 of the LAM (FIG. 6).

Figure 4:
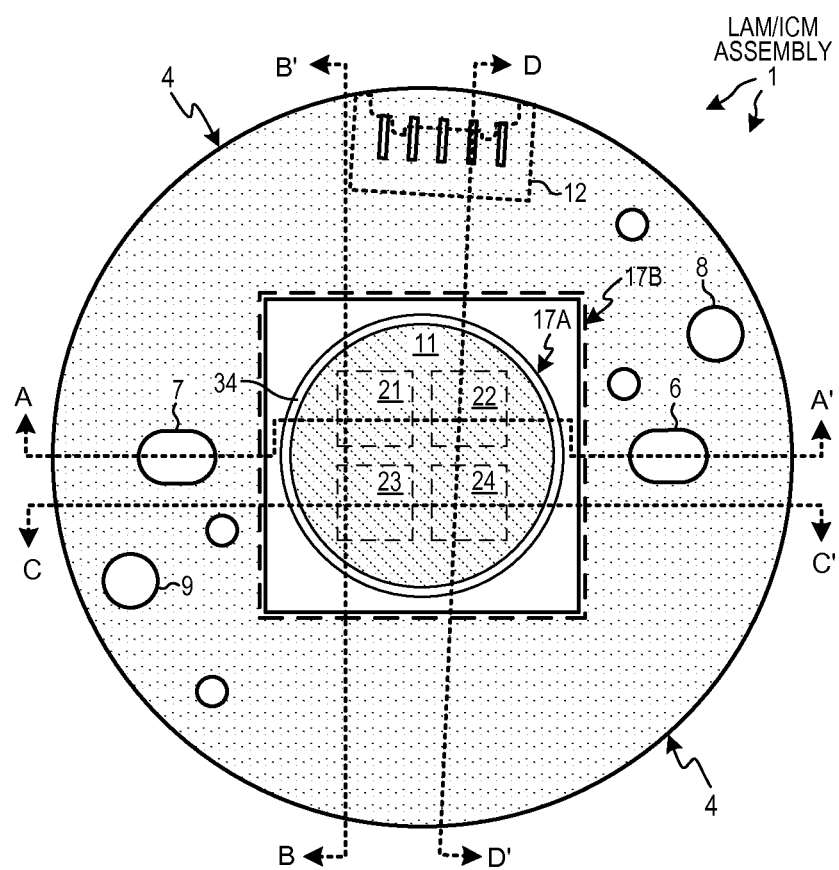
FIG. 4 is a cross-sectional, top-down view of the LAM/ICM assembly of FIGS. 1 and 2.

FIG. 4 is a cross-sectional, top-down diagram of the LAM/ICM assembly 1. The round circle identified by reference numeral 17A is the edge of circular central opening 17 at the upper surface of the ICM. The dashed square identified by reference numeral 17B is the edge of the square-shaped central opening 17 at the bottom surface of the ICM. The four dashed squares 21-24 identify where four LED dice are disposed underneath the silicone 11.

Figure 5:
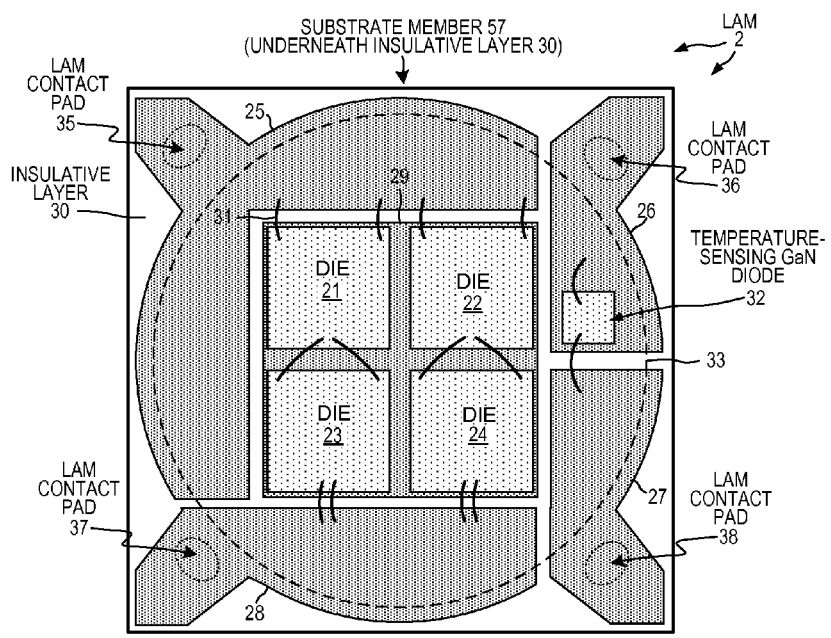
FIG. 5 is top-down view of one example of a LAM usable with the ICM of FIGS. 1 and 2.

FIG. 5 is a simplified top-down diagram of one example of LAM 2, where the silicone and solder mask layers are not shown so that the metallization patterns of die attachment of LED dice 21-24 can be seen. There are five areas of metal 25-29 disposed on an insulative layer 30, where the insulative layer 30 in turn is disposed on the substrate member 57. The insulative layer 30 insulates each of the metal areas from the substrate member 57 of the LAM. The substrate member 57 in this case is a square piece of aluminum sheet. The four LED dice 21-24 are lateral LED dice that are die-attached to the central metal area 29. The LED dice are wire bonded to form two parallel strings. An LED drive current can flow through the first string by flowing from metal area 25, through LED die 21, through LED die 23, and to metal area 28. An LED drive current can flow through the second string by flowing from metal area 25, through LED die 22, through LED die 24, and to metal area 28. Reference numeral 31 identifies one of the bond wires. In addition to LED dice 21-24, LAM 2 includes a temperature sensing GaN diode die 32. In one example, this GaN diode die 32 is of identical construction to the LED dice. In the illustrated example, it is of identical construction except for the fact that it is a smaller die. The anode of GaN diode 32 is coupled via a bond wire to metal area 26. The cathode of GaN diode 32 is coupled via another bond wire to metal area 27. The dashed line 33 identifies the circular outer periphery of a rim 34 that retains the silicone 11. As can be seen from FIGS. 1, 2 and 4, this rim 34 is of a diameter that is just smaller than the inside diameter of the central opening 17 in the upper surface of the ICM. The outwardly extending portions of the metal areas at the corners of the LAM of FIG. 5 are referred to as LAM contact pads because these areas of metal are exposed, and are not covered with soldermask. Reference numerals 35-38 identify these LAM contact pads in the illustration of FIG. 5.

FIG. 6 is a cross-sectional diagram that shows how the LAM 2 fits up into the central opening 17 in the ICM 3. ICM 3 includes an interconnect structure 39, a plurality of electronic components that are mounted to the interconnect structure, and the amount of insulative molded plastic encapsulant 40 that encases and encapsulates the interconnect structure and the electronic components. In the illustrated example, the interconnect structure 39 is a multi-layer printed circuit board (PCB). One of the electronic components 41 of the circuitry is seen in cross-section as a rectangle. Not all of the printed circuit board is actually encapsulated, but rather the bottom of the inside lip 42 of the central opening 17 is not covered with encapsulant so that portions of metallization on this lip 42 can serve as ICM contact pads. Each of the LAM contact pads on the top of the LAM 2 is soldered to corresponding one of the ICM contact pads on the downward facing inside lip 42 of the ICM. In this example, amounts 43 and 44 of solder paste are disposed on the LAM contact pads, and the LAM 2 is moved up and into contact with the ICM 3, and then the assembly is heated in a reflow soldering process to solder the LAM contact pads to the ICM contact pads. Other soldering and mechanical/electrical interface methods such as conductive adhesives could be used instead of reflow soldering with solder paste as described herein.

Figure 7:
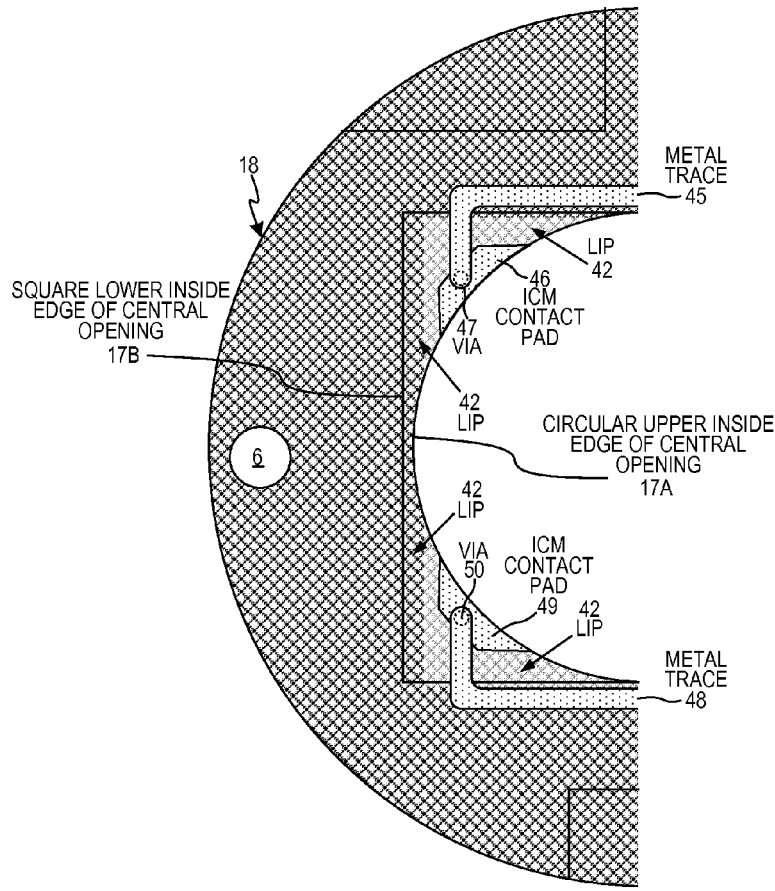
FIG. 7 is a diagram showing one example of an ICM contact pad disposed on the inside lip of the ICM.

FIG. 7 is a view of the bottom of the ICM 3. Metal traces of the printed circuit board 39 extend to the inside lip 42 and connect to ICM contact pads through conductive vias. For example, trace 45 contacts ICM contact pad 46 through conductive via 47. Trace 48 contacts ICM contact pad 49 through conductive via 50.

Figure 8:
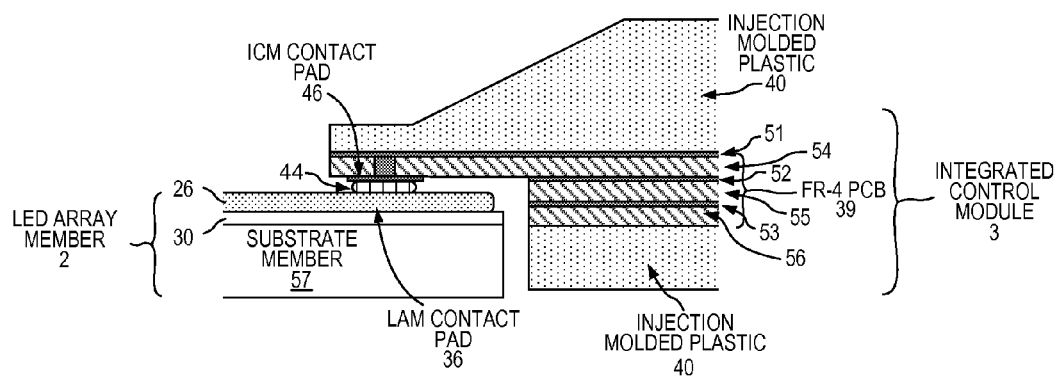
FIG. 8 is a more detailed diagram showing how a LAM contact pad on the peripheral edge of upper surface of the LAM makes contact with a corresponding ICM contact pad in the bottom of the inside lip of the ICM.

FIG. 8 is a view that shows how LAM contact pad 36 is coupled via solder 44 to the corresponding ICM contact pad 46 on the inside lip of the ICM. The PCB 39 includes three metal layers 51, 52 and 53 and three fiberglass layers 54, 55 and 56. The substrate member 57 of the LAM 2 is covered by insulative layer 30. Electrical contact is made from metal area 26, a part of which is LAM contact pad 36, up through solder 44, to ICM contact pad 46, and through a conductive via in the PCB, and to metal interconnect layer 51 of the PCB 39. The interconnect structure described herein is that of a conventional FR-4 PCB; however, other structures such as Kapton "flex circuit" or metal clad PCB circuits can also be used for this interconnect structure.

Figure 9:
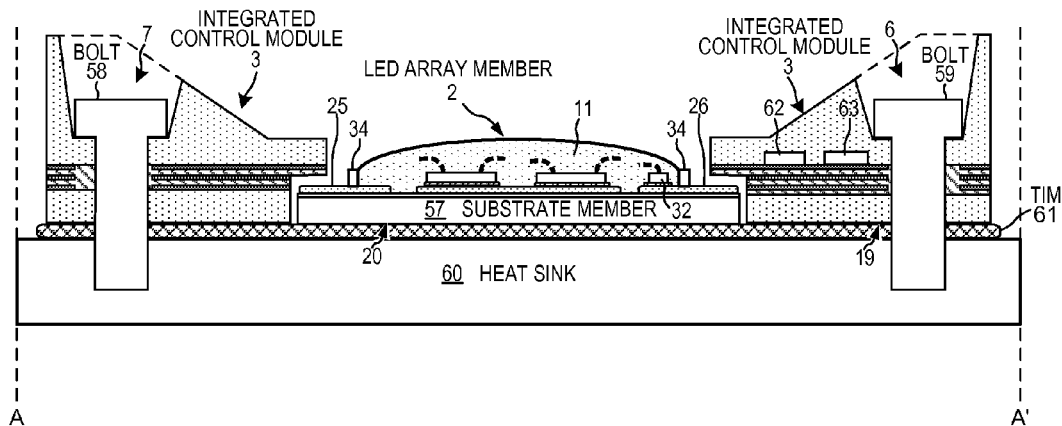
FIG. 9 is a cross-sectional view taken along line A-A' of the LAM/ICM of FIG. 4.

FIG. 9 is a cross-sectional view of the LAM/ICM assembly 1 of FIG. 4 taken along sectional line A-A' (shown on a heat sink 60). Bolts 58 and 59 extend through holes 6-7, and hold the bottom surface 20 of LAM 2 in good thermal contact with the heat sink 60 through a layer 61 of a thermal interface material (TIM). There are no LAM contact pads or ICM contact pads in the cross-section illustrated. Reference numerals 62 and 63 identify additional electronic components of the circuitry mounted on PCB 39. The circuitry is overmolded by the injection molded plastic encapsulant 40.

Figure 10:
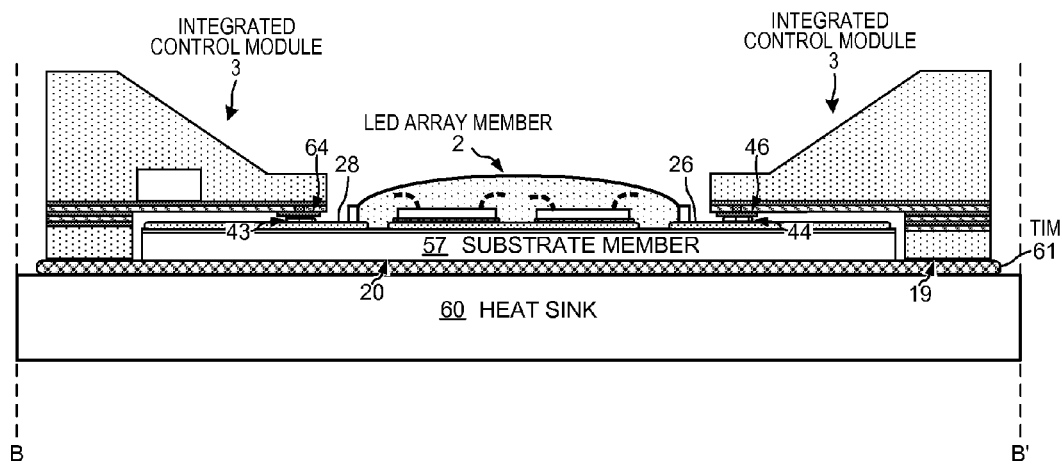
FIG. 10 is a cross-sectional view taken along line B-B' of the LAM/ICM of FIG. 4.

FIG. 10 is a cross-sectional view of the LAM/ICM assembly 1 of FIG. 4 taken along sectional line B-B' (shown on a heat sink). Solder 43 couples LAM contact pad 37 to ICM contact pad 64. Solder 44 couples LAM contact pad 36 to ICM contact pad 46.

Figure 11:
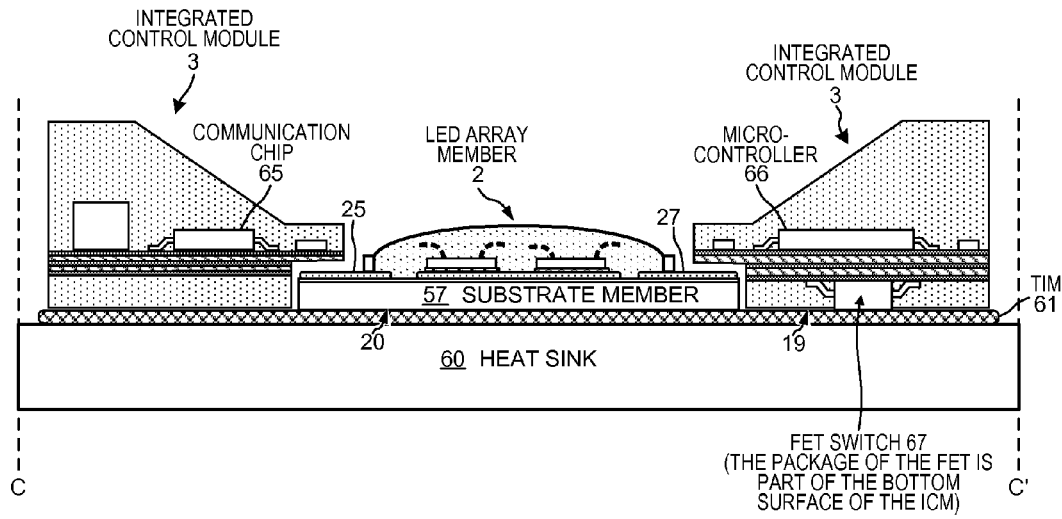
FIG. 11 is a cross-sectional view taken along line C-C' of the LAM/ICM of FIG. 4.

FIG. 11 is a cross-sectional view of the LAM/ICM assembly 1 of FIG. 4 taken along sectional line C-C' (shown on heat sink 60). Electronic components of the circuit as seen in cross-section include a communication integrated circuit 65, a microcontroller integrated circuit 66, and a FET switch 67. Each of these three components is a packaged device that is in turn overmolded by the plastic encapsulant 40 of the ICM. In the case of the FET switch 67, a surface of the package forms a part of the bottom surface of the ICM so that when the ICM is pressed against the heat sink 60 (with the TIM 61 in between), the bottom surface of the FET switch package makes good thermal contact with the heat sink 60. The FET switch package may, for example, be a DCB-isolated SMPD (direct copper bonded isolated surface mount power device) package whose downward facing surface is a heat-dissipating substrate that is intended to be pressed against a heat sink.

Figure 12:
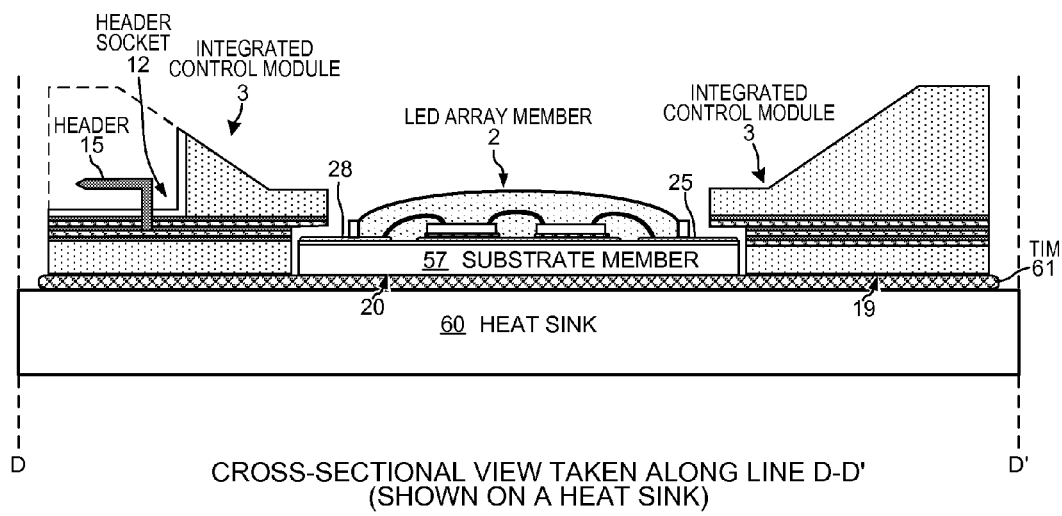
FIG. 12 is a cross-sectional view taken along line D-D' of the LAM/ICM of FIG. 4.

FIG. 12 is a cross-sectional view of the LAM/ICM assembly 1 of FIG. 4 taken along sectional line D-D' (shown on a heat sink).

Figure 13:
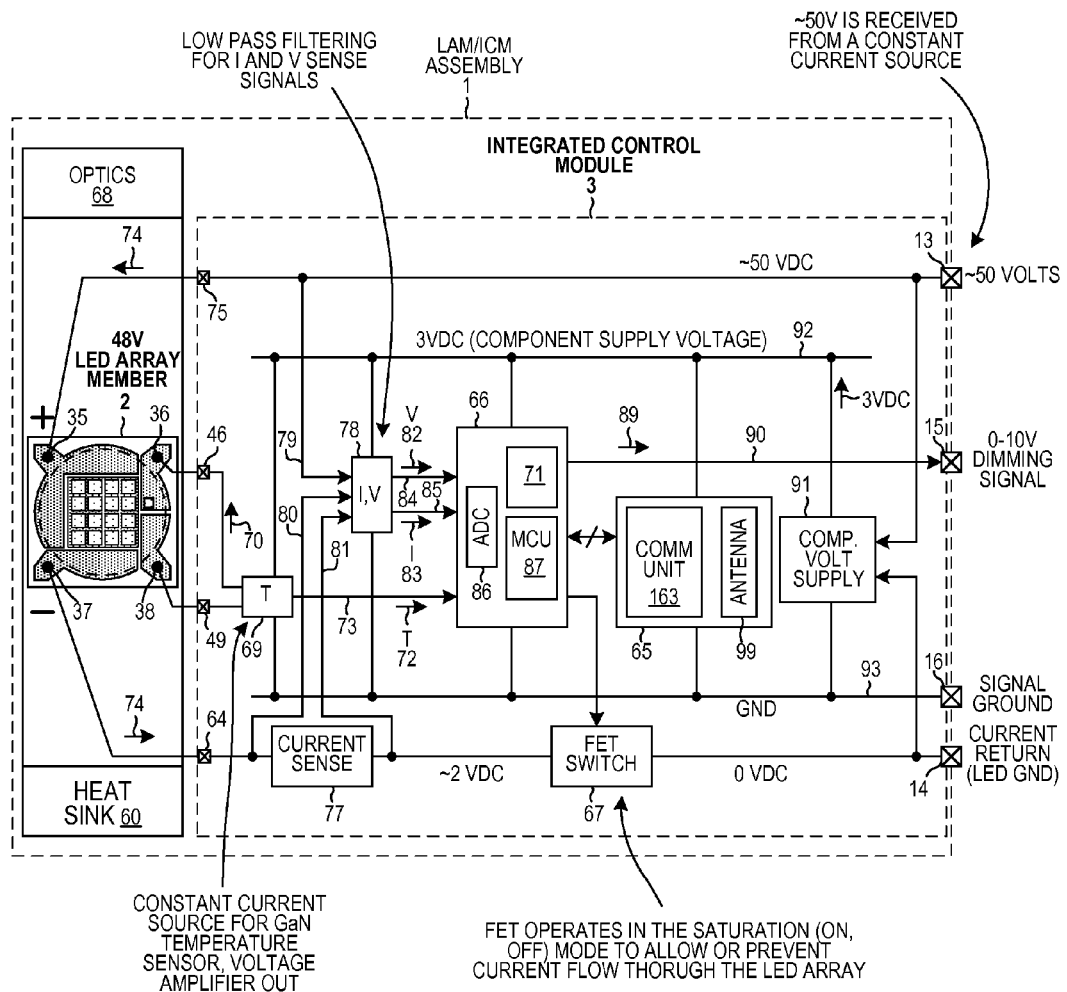
FIG. 13 is a circuit diagram of the LAM/ICM assembly in accordance with a second novel aspect, in an example in which the AC-to-DC converter outputs a regulated constant current and the AC-to-DC converter receives a control signal back from the LAM/ICM assembly.

FIG. 13 is a diagram of the LAM/ICM assembly 1 in accordance with a second novel aspect. The LAM/ICM assembly 1 is illustrated with the heat sink 60 and with optics 68 denoted as blocks. The microcontroller 66 monitors the temperature of the LAM 2 via a temperature interface circuit 69. Temperature interface circuit 69 includes a constant current source that supplies a constant current 70 to the temperature sensing GaN die 32 via ICM contact pad 46, LAM contact pad 36, LAM contact pad 38 and ICM contact pad 49. The temperature interface circuit 69 also includes a voltage amplifier that amplifies the sensed voltage across LAM contact pads 36 and 38 and supplies the resulting amplified voltage signal T 72 to the microcontroller 66 via conductor 73. In addition, microcontroller 66 monitors the voltage V with which the LEDs of LAM 2 are driven. This LED drive voltage is the voltage between LAM contact pads 35 and 37. A current and voltage measuring interface circuit 78 measures this voltage via conductors 79 and 80. In addition, microcontroller 66 monitors the LED drive current 74 flowing through the LEDs of the LAM 2. This current 74 flows from pin 13, through ICM contact pad 75, through LAM contact pad 35, through the LEDs, through LAM contact pad 37, through ICM contact pad 64, through current sense resistor 77, through FET switch 67, out of the LAM/ICM assembly via pin 14. The current and voltage measuring interface circuit 78 detects the LED drive current 74 as the voltage dropped across the current sense resistor 77. This voltage is detected across conductors 80 and 81. The voltage and current measuring interface circuit 78 receives the voltage sense and current sense signals, low pass filters them, amplifies them, and performs level shifting and scaling to generate a voltage sense signal V 82 and a current sense signal I 83. The voltage and current sense signals 82 and 83 are supplied to the microcontroller 66 via conductors 84 and 85, respectively.

The T signal 72, the V signal 82, and the I signal 83 are converted into digital values by the analog-to-digital converter (ADC) 86 of the microcontroller. A main control unit (MCU) 87 of the microcontroller executes a program 71 of processor-executable instructions. The I, V and T signals, as well as information received from communication integrated circuit 65, are used by the MCU 87 to determine how to control FET switch 67. In the present example, the MCU 87 can control the FET switch to be nonconductive, thereby turning off the LEDs. The MCU 87 can control the FET switch to be fully conductive, thereby turning on the LEDs to a brightness proportional to the current supplied by the AC-DC converter as controlled by the zero to ten volt signal also produced by the MCU as directed by the control program. As explained in further detail below, the ICM 3 receives a substantially constant current via pins 13 and 14 from an AC-to-DC power supply circuit 88 (see FIG. 14).

The AC-to-DC power supply circuit 88 has a constant current output, the magnitude of the constant current being controllable by a zero to ten volt signal received by the AC-to-DC power supply circuit. The voltage that results across pins 13 and 14 when this constant current is being supplied to the LAM/ICM assembly 1 is about 50 volts. The microcontroller 66 controls the FET switch 67 to be fully on with nearly zero voltage across it when the LAM is to be illuminated. To accomplish control for a desired LED brightness (desired amount of current flow through the LEDs of the LAM), the microcontroller 66 sends a zero to ten voltage dimming control signal 89 back to the AC-to-DC power supply circuit 88 via conductor 90, and data terminal 15. The microcontroller 66 uses this control signal 89 to increase and to decrease the magnitude of the constant current 74 being output by the AC-to-DC power supply circuit 88. The circuit components 69, 78, 66 and 65 are powered from a low DC supply voltage such as 3 volts DC. A component voltage supply circuit 91 generates this 3 volt supply voltage from the 50 volts across pins 13 and 14. The 3 volt supply voltage is supplied onto voltage supply conductor 90. Conductor 93 is the ground reference conductor for the component supply voltage. Because only a small amount of power is required to power the circuitry embedded in the ICM, the component voltage supply circuit 91 may be a simple linear voltage regulator.

Figure 14:
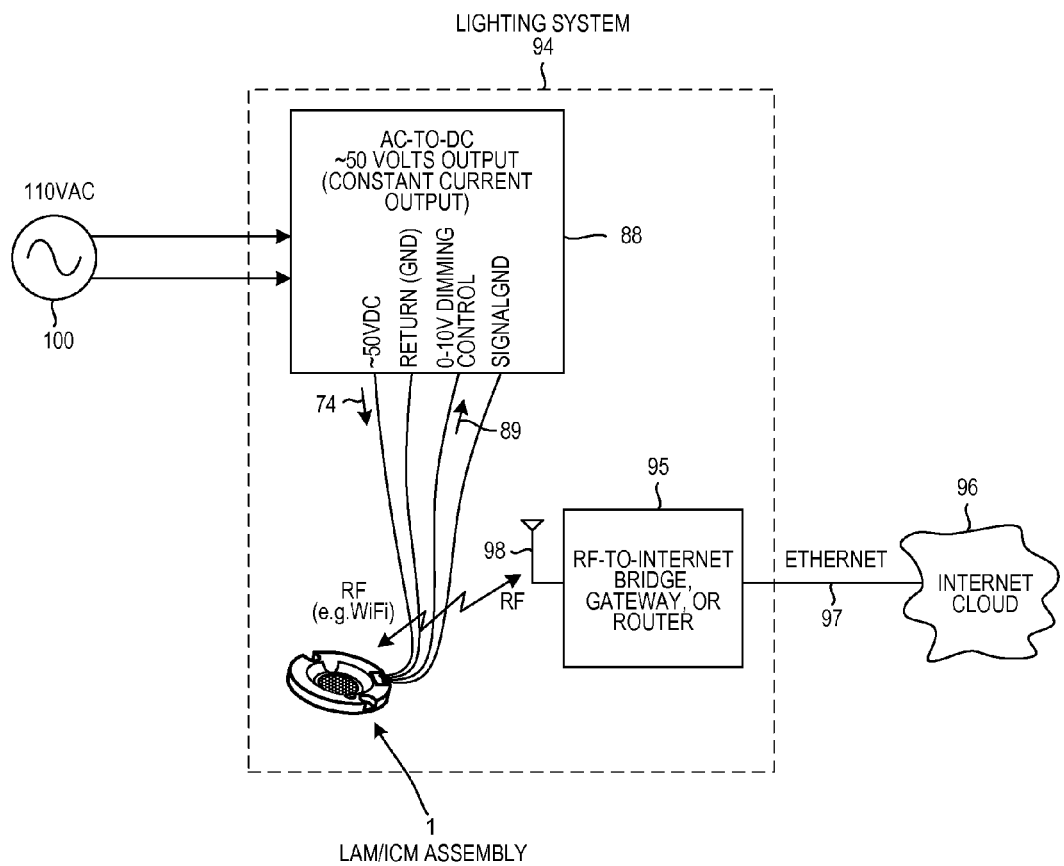
FIG. 14 is a diagram of a lighting system that includes the LAM/ICM assembly of FIG. 13.
Figure 15:
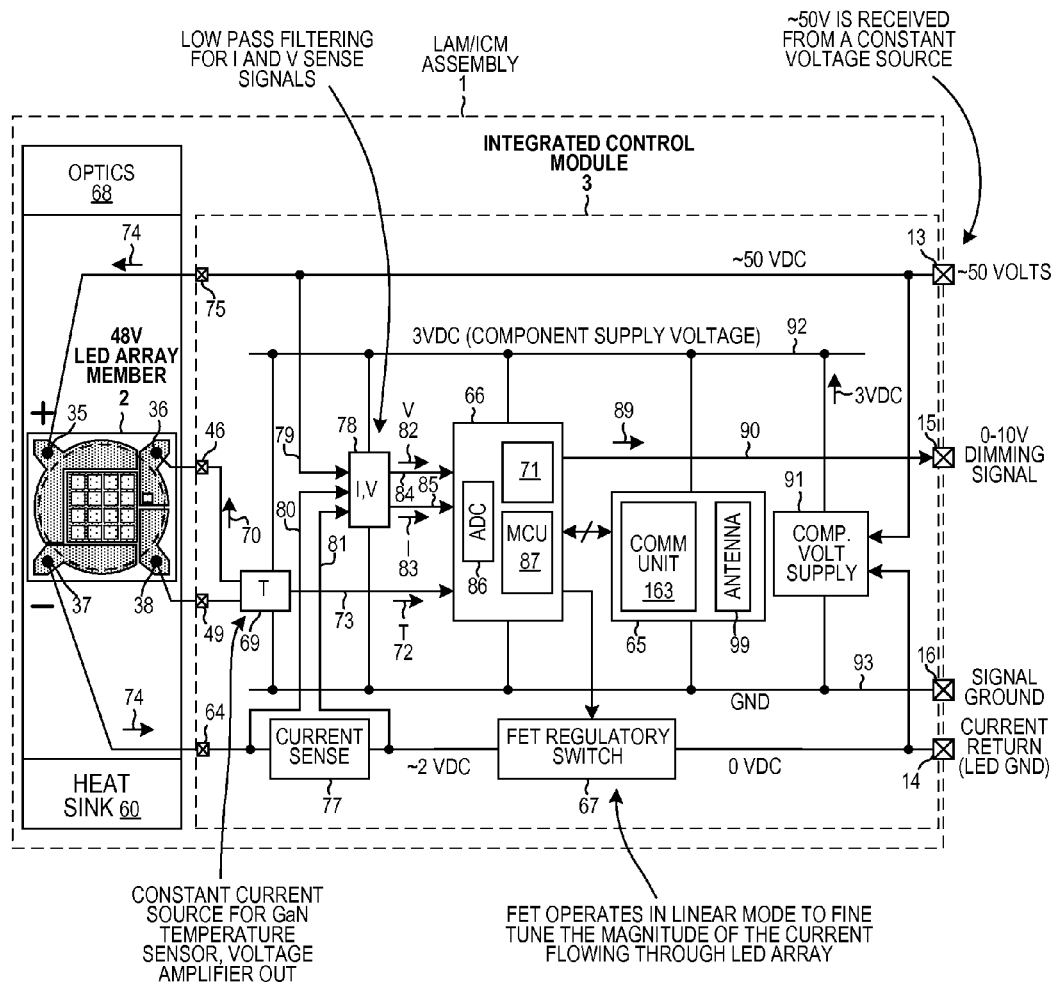
FIG. 15 is a circuit diagram of the LAM/ICM assembly in accordance with the second novel aspect, in an example in which the AC-to-DC converter outputs a regulated constant voltage.

FIG. 14 is a system level diagram of a lighting system 94. Lighting system 94 includes the power supply circuit 88, the LAM/ICM assembly 1, and internet connectivity circuitry 95. The LEDs of the LAM can be monitored and controlled remotely by communicating across the internet 96. Information can be communicated from the internet 96, across an ethernet connection 97, through the internet connectivity circuitry 95, from antenna 98 of the internet connectivity circuitry 95 to the antenna 98 of the LAM/ICM assembly 1 in the form of an RF transmission, through transceiver 163 of the communication integrated circuit 65, and to the MCU 87 of the microcontroller 66. Information can also be communicated in the opposite direction from the MCU 87 of the microcontroller 66, through the transceiver 163 of the communication integrated circuit 65, from antenna 99 in the form of an RF transmission to antenna 98, through the internet connectivity circuitry 95, across ethernet connection 97, to the internet 96. The lighting system 94 is typically part of a luminaire (light fixture) that is powered by ordinary 110 VAC wall power. Symbol 100 represents a source of 110 VAC wall power for the luminaire.

FIG. 14 shows that if the AC-to-DC supply is a constant voltage supply, the MCU 87 can control the FET switch to operate in the FET's linear mode in order to control the magnitude of the constant current 74 supplied to the LEDs of the LAM, thereby adjusting the brightness of the LEDs. When operating in this linear mode way, the voltage drop across the FET switch should be about two volts. As explained in further detail below, the ICM 3 receives a substantially constant voltage via pins 13 and from an AC-to-DC power supply circuit that has a constant voltage output, the magnitude of the constant voltage being controllable by a zero to ten volt signal received by the AC-to-DC power supply circuit. The voltage that results across pins 13 and 14 when this constant current is being supplied to the LAM/ICM assembly 1 is about 50 volts (or more accurately about 2 volts greater than the forward voltage of the LAM). The microcontroller 66 controls the FET switch 67 to fine tune the amount of current supplied to the LEDs of the LAM by adjusting the voltage drop across the FET switch to that amount required to achieve the necessary current flow. The voltage drop across FET switch 67 is about two volts or less depending on the current required, it will be nearest zero when maximum current is flowing and nearest 2 volts when minimum current is flowing. Note that to turn the LEDs off, the FET switch will be turned off, and the voltage across it will be much greater than 2 volts, but since no current is flowing through the FET, no power will be generated within the FET. To prevent excessive power dissipation by the FET when operating in the linear region, the voltage applied to the ICM must be within two volts of the forward voltage required to illuminate the LED. To accomplish this for a desired LED brightness (desired amount of current flow through the LEDs of the LAM), the microcontroller 66 sends a zero to ten voltage dimming control signal 89 back to the AC-to-DC power supply circuit 88 via conductor 90, and data terminal 15. The microcontroller 66 uses this control signal 89 to increase and to decrease the magnitude of the constant voltage being output by the AC-to-DC power supply circuit 88. The circuit components 69, 78, 66 and 65 are powered from a low DC supply voltage such as 3 volts DC. A component voltage supply circuit 91 generates this 3 volt supply voltage from the 50 volts across pins 13 and 14. The 3 volt supply voltage is supplied onto voltage supply conductor 90. Conductor 93 is the ground reference conductor for the component supply voltage. Because only a small amount of power is required to power the circuitry embedded in the ICM, the component voltage supply circuit 91 may be a simple linear voltage regulator.

Figure 16:
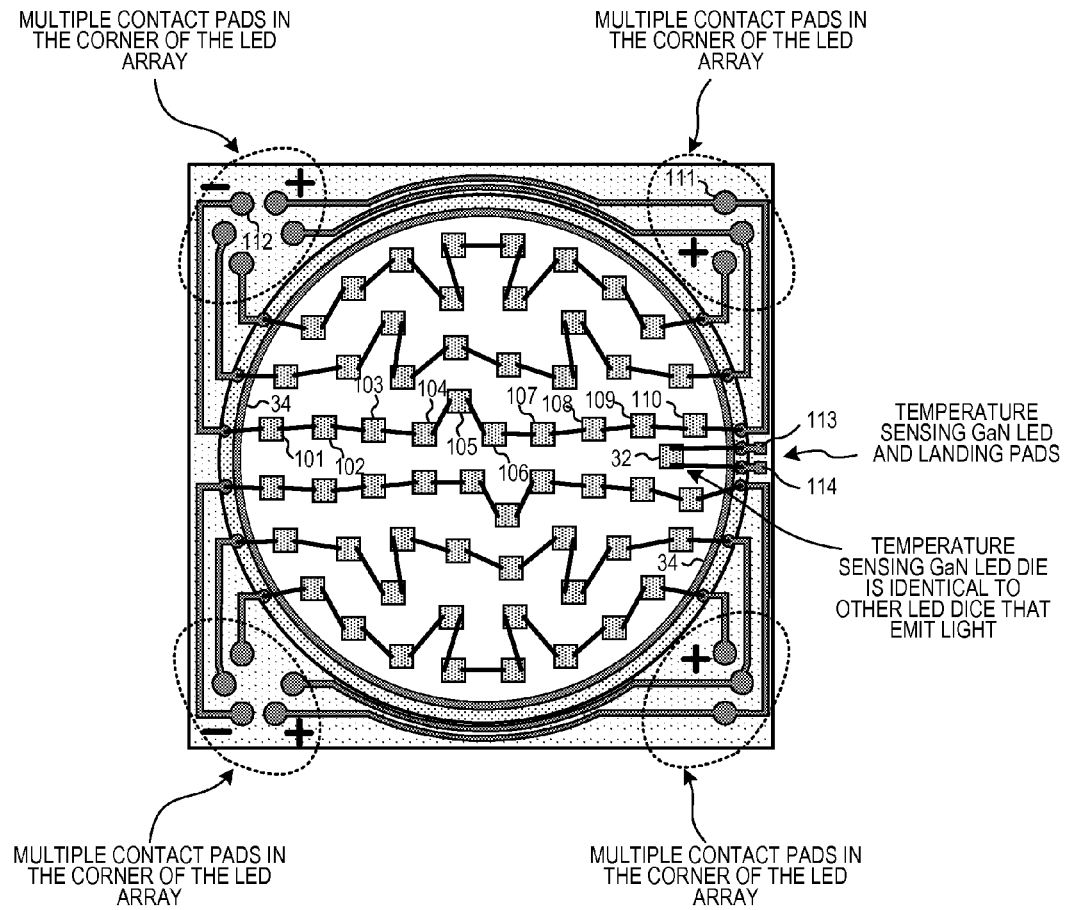
FIG. 16 is a top-down diagram of another example of a LAM that can be used with the ICM of FIGS. 1 and 2.

FIG. 16 is a top-down diagram of another example of a LAM usable with the ICM. In this example, there are multiple LAM contact pads in each corner of the LAM, and there are multiple separately controllable strings of LED dice. One of these strings includes LED dice 101-110. An LED drive current can be supplied to this string via LAM contact pad 111 and LAM contact pad 112. There are six such separately controllable strings of the LED dice. The GaN temperature sensing diode is identified by reference numeral 32. The LAM contact pads through which the GaN temperature sensing diode 32 is driven and monitored are LAM contact pads 113 and 114. Reference numeral 34 identifies the rim that retains the silicone that covers the LED dice. The silicone is not illustrated in FIG. 16 so that the LED dice disposed under it can be seen in the illustration.

Figure 17:
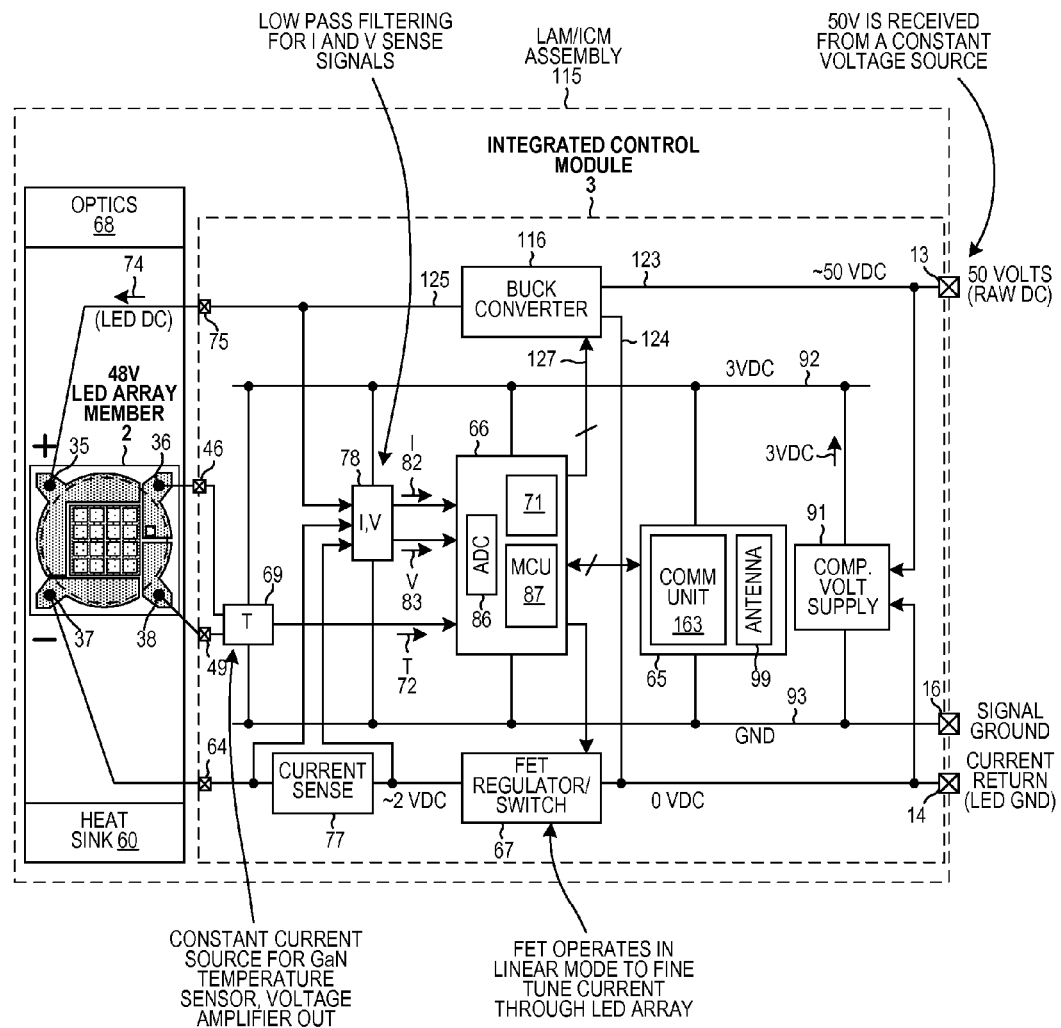
FIG. 17 is a circuit diagram of the LAM/ICM assembly in accordance with a third novel aspect.

FIG. 17 is a diagram of an LAM/ICM assembly 115 in accordance with a third novel aspect. The LAM/ICM assembly 115 is similar to the LAM/ICM assembly 1 of FIG. 13 explained above, except that: 1) the LAM/ICM assembly 115 of FIG. 17 does not output a 0-10 volt dimming control signal, and 2) the LAM/ICM assembly 115 includes a switching DC-to-DC converter 116. In the example of FIG. 17, the switching DC-to-DC converter is a buck converter.

FIG. 18 is a more detailed diagram of the buck converter 116. The buck converter 116 includes a programmable oscillator 117, a switch 118, a diode 119, and inductor 120, and a capacitor 121. Programmable oscillator 117 supplies a rectangular wave digital drive signal 122 to the switch 118. This drive signal causes the switch to turn on and off in a cyclical fashion. The 50-volt supply voltage from pin 13 is received between conductor 123 and conductor 124. From this 50 volts supply voltage, the buck converter 116 generates and outputs the LED drive current 74 at about 48 volts to the LAM via conductor 125. Microcontroller 66 adjusts the frequency and/or duty cycle of signal 112 by sending multi-bit digital control information 126 to the oscillator 116 across conductors 127. By adjusting the frequency and/or duty cycle of signal 112, the microcontroller 66 controls the magnitude of the nominal output current 74 that the buck converter 116 supplies on conductor 125 to the LEDs of the LAM.

FIG. 19 is a table that sets forth parameters of operation for the buck converter 116 using 10 MHz nominal switching frequency for the purpose of this explanation. The switching frequency can be substantially higher, as required by the voltages and currents of a particular LAM.

Figure 20:
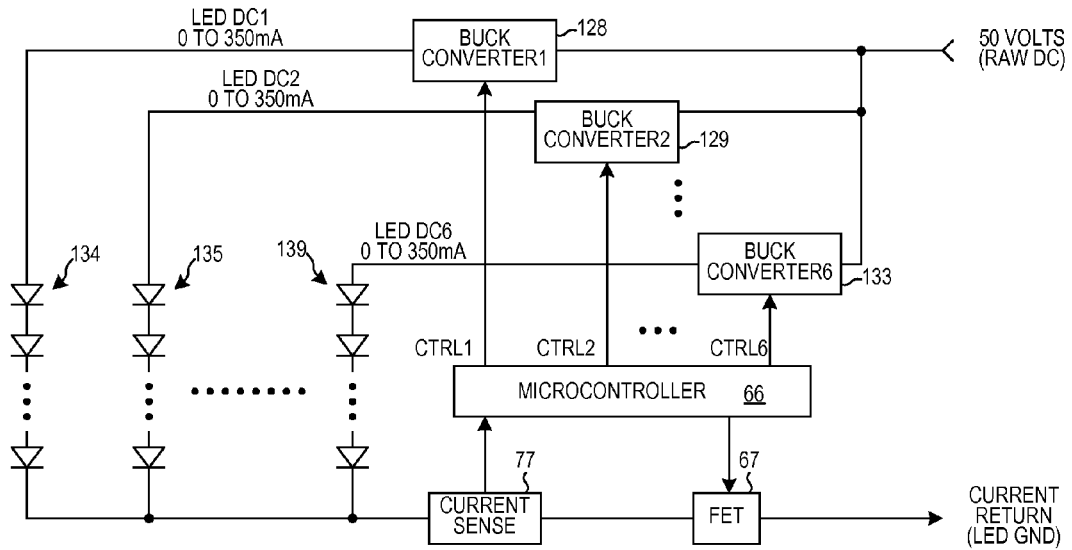
FIG. 20 is a diagram illustrating a first way to drive multiple LED strings with multiple buck converters, where the multiple buck converters are parts of the ICM.

FIG. 20 is a diagram illustrating a first way to drive multiple LED strings with multiple buck converters, where the multiple buck converters are parts of the ICM. In the example of FIG. 20, the buck converter block 116 of FIG. 17 actually includes multiple buck converters 128-133. In addition, the LAM includes multiple strings 134-139 of LEDs that can be driven independently. Microcontroller 66 controls each of the buck converters separately by sending each buck converter different digital control information across different control lines. The microcontroller 66 controls the frequency and/or duty cycle output by each buck converter's programmable oscillator 117 separately. The microcontroller 66 monitors current flow through each string of LEDs one at a time using the same single current sense resistor 77. Providing multiple buck converters in this way reduces the physical size of the inductors of the buck converters as indicated in the right column of FIG. 19. Where six LED strings are separately driven, each by a separate buck converter, the approximate physical size of the inductor of each buck converter is 2.5 mm by 2.5 mm by 1.0 mm. This small inductor size facilitates encapsulation in a slim ICM profile. While it has been illustrated that each buck converter could be controlled by individual control signals, it is equally possible to implement the system where a single oscillator is used to drive multiple buck converter circuits composed only of the switch 118, diode 119, inductor 120 and capacitor 121, thus further saving on the amount of components required while keeping the physical size of the components as small as possible.

Figure 21:
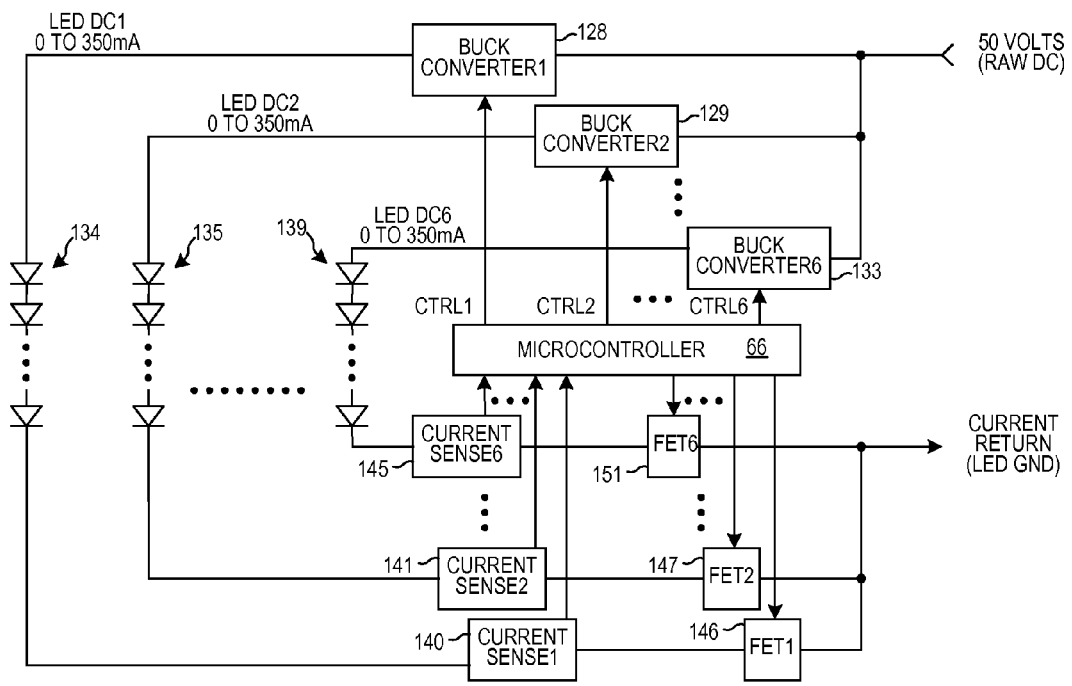
FIG. 21 is a diagram illustrating a second way to drive multiple LED strings with multiple buck converters, where the multiple buck converters are parts of the ICM.

FIG. 21 is a diagram illustrating a second way to drive multiple LED strings with multiple buck converters, where the multiple buck converters are parts of the ICM. In this case, each string of LEDs has a corresponding dedicated current sense resistor and FET switch. Current sense resistor 140 and FET switch 146 are for the first LED string 134. Current sense resistor 141 and FET switch 147 are for the second LED string 135. Current sense resistor 145 and FET switch 151 are for the sixth LED string 139.

Figure 22:
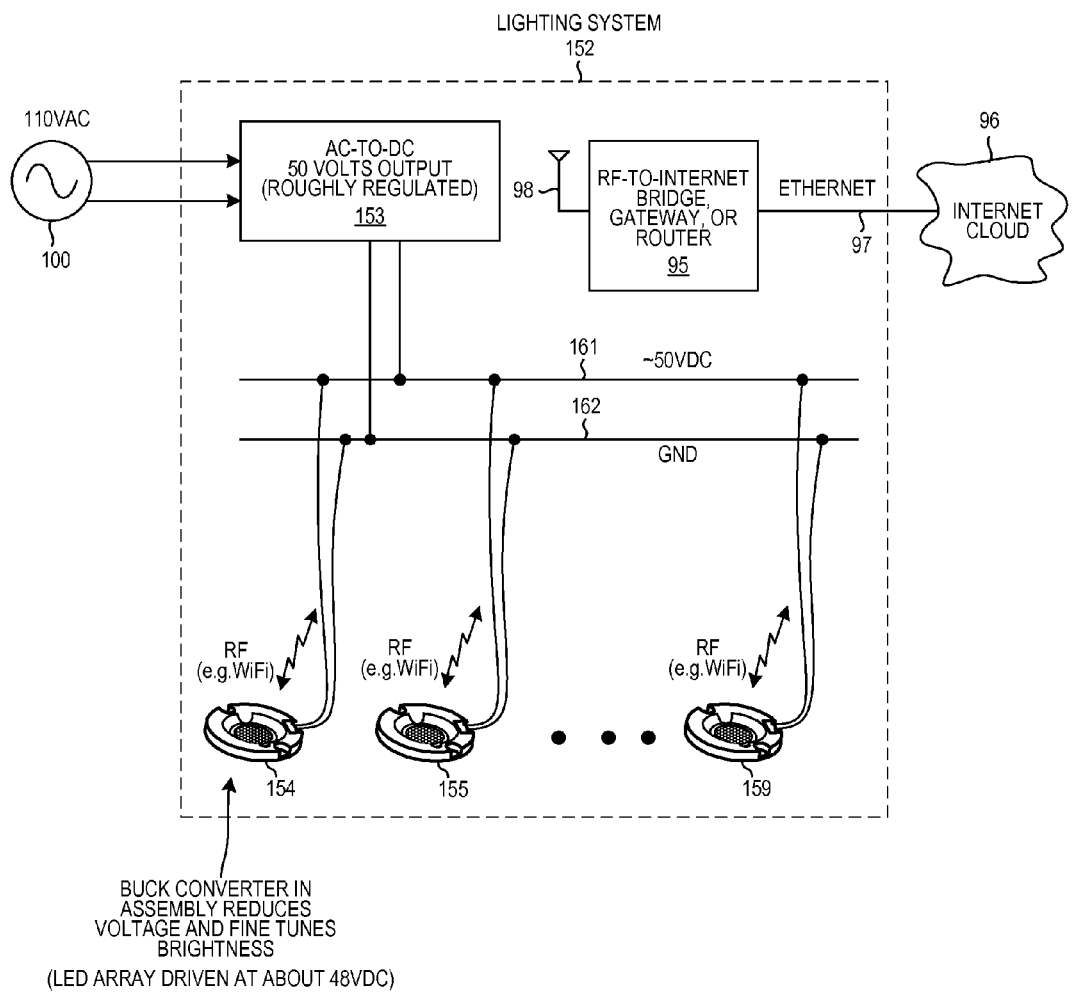
FIG. 22 is a diagram of a lighting system that includes the LAM/ICM assembly of FIG. 17.

FIG. 22 is a diagram of a lighting system 152 that includes multiple instances of the LAM/ICM assembly 115 of FIG. 17 in accordance with the third novel aspect. Lighting system 152 includes an AC-to-DC power supply 153, multiple LAM/ICM assemblies 154-159 of the type shown in FIG. 17, and internet connectivity circuitry 95. Bidirectional communication between each of the LAM/ICM assemblies and the internet 96 via internet connectivity circuitry 95 is the same as described above in connection with FIG. 14. Unlike the AC-to-DC power supply 88 of the embodiment of FIG. 14 that outputs a regulated substantially constant current (the magnitude of which is adjustable), the AC-to-DC power supply 153 of the embodiment of FIG. 22 outputs a substantially constant voltage that is only roughly regulated. This roughly regulated voltage, in the example of FIG. 22, is 50 volts. This roughly regulated voltage is supplied in parallel to the many LAM/ICM assemblies via conductors 161 and 162 as shown. The control of the amount of LED drive current supplied to the LEDs of an individual LAM/ICM assembly is controlled by the switching DC-to-DC converter (for example, a buck converter) within the LAM/ICM assembly itself. Each LAM/ICM assembly controls the amount of LED drive current being supplied to its own LEDs. The AC-to-DC power supply 153 therefore can output a supply voltage that is only roughly regulated. The AC-to-DC power supply 153 need not receive any 0-10 volt control signal to control its output.

Although an ICM having an embedded DC-to-DC converter is described above in connection with a specific example in which the switching DC-to-DC converter embedded in the ICM is a step-down buck converter, this is but one example. In other examples, the embedded switching DC-to-DC converter is a boost converter whose input voltage is lower than its output voltage. The voltage as received by the embedded boost converter is lower than the voltage (LEDDC) at which the LED array is driven. In other examples, the embedded switching DC-to-DC converter is a combination boost/buck converter whose incoming input voltage can be either higher or lower than the converter output voltage. The voltage as received by the embedded boost/buck converter may be higher or lower than the voltage (LEDDC) at which the LED array is driven. The embedded switching DC-to-DC converter may also be a Single-Ended Primary-Inductor Converter) SEPIC converter whose output voltage can be less than, equal to, or greater than its input voltage. Any DC-to-DC converter topology whose characteristics are suitable for the ICM application can be employed.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An assembly comprising:
    an integrated control module (ICM) that defines a central opening, wherein the central opening has a substantially circular upper peripheral edge and a substantially rectangular lower peripheral edge, wherein the substantially circular upper peripheral edge has a smaller periphery than the substantially rectangular lower peripheral edge, wherein the ICM includes electronic circuitry;
    a substrate member that includes an interconnect layer and a plurality of contact pads, wherein the contact pads are disposed on an upper surface of the substrate member, wherein the substrate member fits up into the central opening in the ICM and is attached to the ICM; and
    a light emitting diode (LED) disposed on the substrate member, wherein the LED is controlled by the electronic circuitry.

2. The assembly of claim 1, wherein power is supplied to the LED through the electronic circuitry.

3. The assembly of claim 1, further comprising:
    an amount of luminescent material disposed over the LED.

4. The assembly of claim 1, wherein the substrate member has a rectangular upper peripheral edge that is substantially the same size as the rectangular lower peripheral edge of the central opening of the ICM.

5. The assembly of claim 1, wherein the ICM includes an encapsulant and an interconnect structure, wherein the encapsulant encases the interconnect structure and the electronic circuitry, and wherein the interconnect structure is adapted to hold the substrate member in thermal contact with a heat sink such that a bottom surface of the substrate member is in thermal contact with the heat sink and such that light emitted from the LED passes in a direction away from the heat sink through the central opening.

6. The assembly of claim 1, wherein the ICM includes an encapsulant and a multi-layer printed circuit board, wherein the electronic circuitry is mounted to the multi-layer printed circuit board, and wherein the encapsulant encases the multi-layer printed circuit board and the electronic circuitry.

7. The assembly of claim 1, wherein the ICM includes an encapsulant and an interconnect structure, wherein the electronic circuitry is mounted to the interconnect structure, wherein the encapsulant encases the interconnect structure and the electronic circuitry, and wherein the encapsulant forms an upper surface of the ICM.

8. The assembly of claim 1, wherein the ICM includes an encapsulant that encases the electronic circuitry, wherein the encapsulant forms an upper surface of the ICM, and wherein the upper surface of the ICM has a substantially circular outer peripheral edge.

9. The assembly of claim 1, wherein the electronic circuitry is a microcontroller that generates a control signal that dims the LED.

10. The assembly of claim 1, wherein the electronic circuitry is disposed within an electronic package, and wherein a part of the electronic package forms a part of a bottom surface of the ICM.

11. A device comprising:
a molded encapsulant material that defines a central opening with a peripheral edge;
an interconnect structure with an inside lip under the peripheral edge of the central opening, wherein contact pads are disposed on the inside lip of the interconnect structure; and
electronic circuitry that controls a light emitting diode (LED), wherein the electronic circuitry is at least in part encapsulated by the molded encapsulant material, wherein the contact pads are adapted to be coupled to the LED such that the electronic circuitry can power the LED via the contact pads, and wherein the device comprises no LED.

12. The device of claim 11, further comprising:
a power terminal disposed on an upper surface of the molded encapsulant material, and wherein the electronic circuitry is coupled to be powered via the power terminal.

13. The device of claim 11, further comprising:
a terminal through which digital signals are communicated out of the device, wherein the terminal disposed on an upper surface of the molded encapsulant material.

14. The device of claim 11, wherein the electronic circuitry is a microcontroller that generates a dimming signal that varies power supplied to the LED.

15. The device of claim 11, wherein the electronic circuitry includes an amount of digital logic.

16. The device of claim 11, wherein the electronic circuitry is a part of an RF (Radio Frequency) transmitter.

17. The device of claim 11, wherein the electronic circuitry is a switching DC-to-DC converter whose input voltage is higher than its output voltage.

18. The device of claim 11, wherein the interconnect structure is a layer of patterned sheet metal, and wherein the electronic circuitry is mounted to the patterned sheet metal.

19. The device of claim 11, wherein the interconnect structure is a flexible printed circuit, and wherein the electronic circuitry is mounted to the flexible printed circuit.

20. The device of claim 11, wherein the inside lip is substantially the same size as an upper peripheral edge of a substrate upon which the LED is mounted.

* * * * *